(12) United States Patent
Muller

(10) Patent No.: US 8,344,453 B2
(45) Date of Patent: Jan. 1, 2013

(54) METHOD OF MANUFACTURING LOCALIZED SEMICONDUCTOR-ON-INSULATOR (SOI) STRUCTURES IN A BULK SEMICONDUCTOR WAFER

(75) Inventor: Markus Gerhard Andreas Muller, Brussels (BE)

(73) Assignee: NXP B.V., Eindhoven (NL)

( * ) Notice: Subject to any disclaimer, the term of this patent is extended or adjusted under 35 U.S.C. 154(b) by 270 days.

(21) Appl. No.: 12/738,141

(22) PCT Filed: Oct. 14, 2008

(86) PCT No.: PCT/IB2008/054217
§ 371 (c)(1),
(2), (4) Date: Apr. 15, 2010

(87) PCT Pub. No.: WO2009/050645
PCT Pub. Date: Apr. 23, 2009

(65) Prior Publication Data
US 2010/0258809 A1 Oct. 14, 2010

(30) Foreign Application Priority Data
Oct. 18, 2007 (EP) .................... 07291271

(51) Int. Cl.
*H01L 21/20* (2006.01)
(52) U.S. Cl. ......... 257/347; 257/E29.062; 257/E21.133; 257/E21.562; 438/164
(58) Field of Classification Search .......... 257/66, 257/347, E29.062, E21.133, E21.132, E21.562; 438/164, 222, 479
See application file for complete search history.

(56) References Cited

U.S. PATENT DOCUMENTS

| | | | |
|---|---|---|---|
| 5,321,298 A | 6/1994 | Moslehi | |
| 5,494,837 A | 2/1996 | Subramanian et al. | |
| 6,506,663 B1 | 1/2003 | Barlocchi et al. | |
| 6,555,891 B1 | 4/2003 | Furukawa et al. | |
| 6,800,518 B2 * | 10/2004 | Bendernagel et al. | 438/207 |
| 7,183,573 B2 * | 2/2007 | Bryant et al. | 257/66 |
| 7,250,642 B2 * | 7/2007 | Masumoto et al. | 257/192 |
| 2006/0040476 A1 | 2/2006 | Sadana et al. | |
| 2006/0057859 A1 * | 3/2006 | Chen | 438/765 |
| 2007/0218654 A1 * | 9/2007 | Spencer et al. | 438/478 |
| 2007/0266933 A1 * | 11/2007 | Tsuchiya et al. | 117/92 |

FOREIGN PATENT DOCUMENTS

| EP | 0366013 A2 | 5/1990 |
|---|---|---|
| EP | 1193752 A1 | 4/2002 |

OTHER PUBLICATIONS

"Chemical Reactions Used in Silicon Epitaxy" Silicon Processing for the VLSI ERA; Lattice Press, Sunset Beach, CA, US; vol. 1; Jan. 1, 1986; pp. 133-136.
"Simultaneous Single-Crystal/Poly Deposition (SSPD)"; Silicon Processing for the VLSI ERA, vol. 2; Lattice Press, Sunset Beach, CA, US; 1990; p. 60.
Shu, K. Y., et al; "GE Composition in SiL-xGEX Films Grown From SiH2C12/GeH4 Precursors"; Journal of Applied Physics, American Institute of Physics, New York, US; vol. 88, No. 7.
Surgo, K., et al; "Seeding Lateral Epitaxy of Silicon on Insulator With Improved Seed and Cap Structure by Pseudoline Shaped Electron Beam Annealing"; Applied Physics Letter 47 (7), Oct. 1, 1985; pp. 696-699.

* cited by examiner

*Primary Examiner* — Wensing Kuo

(57) ABSTRACT

A method of forming a localized SOI structure in a substrate (10) wherein a trench (18) is formed in the substrate, and a dielectric layer (20) is formed on the base of the trench (18). The trench is filled with semiconductor material (22) by means of epitaxial growth.

16 Claims, 3 Drawing Sheets

METHOD OF MANUFACTURING LOCALIZED SEMICONDUCTOR-ON-INSULATOR (SOI) STRUCTURES IN A BULK SEMICONDUCTOR WAFER

FIELD OF THE INVENTION

This invention relates to a method of manufacturing localized SOI structures in a bulk semiconductor, particularly, but not necessarily exclusively, for use in fabricating a starting material for CMOS integration.

As the rapid scaling of semiconductor devices continues, control of parasitic effects, such as short channels effects and drain-induced barrier lowering, become increasingly critical. One of the conventional solutions to these problems is to use SOI substrates, wherein a thin layer of silicon is separated from the bulk silicon substrate by a buried oxide layer across the entire wafer. However, the buried oxide layer is a poor thermal conductor. Furthermore, with respect to integration of core and peripheral devices on a single wafer, it is often desirable to provide only the core devices on SOI and provide the peripheral devices on bulk silicon to ensure better matching. It is therefore desirable to provide a semiconductor wafer having localized SOI regions.

BACKGROUND OF THE INVENTION

European Patent Application No. EP-A-1193752 describes a method of forming localized SOI structures in a semiconductor wafer, wherein a dielectric (oxide) is formed over the entire surface of the substrate, then a polysilicon layer is deposited over the dielectric. Thereafter, the polysilicon layer and the dielectric layer are etched to correspond with the desired SOI region. Semiconductor material is deposited over the entire surface, leading to growth on the exposed regions of the wafer and growth on the polysilicon layer.

The semiconductor material is deposited by epitaxial growth which, in the region of the polysilicon layer, gives rise to a polycrystalline layer, in a thickness of 10 to 30 microns. This layer must be thermally treated in order to generate a monocrystalline region over the oxide. After provision of a cap oxide, the wafer is placed in a rapid thermal reactor to melt the polycrystalline layer and recrystallize it during the freezing step of the rapid thermal annealing. However, there is a likelihood that the thermal treatment will not yield a completely monocrystalline semiconductor region over the insulating layer: the polysilicon grains will grow but not necessarily disappear during the thermal treatment and it is not a straightforward matter to try and control the process to achieve the desired result.

SUMMARY OF THE INVENTION

It is therefore an object of the present invention to provide an improved method of manufacturing a localized semiconductor-on-insulator (SOI) structure in a bulk semiconductor wafer, wherein the above-mentioned drawbacks are alleviated.

In accordance with the present invention, there is provided a method of forming a localized semiconductor-on-insulator (SOI) structure in a bulk semiconductor substrate, the method comprising:

a) forming a trench in the surface of said substrate at the required location thereon of said SOI structure;

b) forming a dielectric layer on the base of said trench, leaving a portion of the semiconductor sidewalls thereof exposed; and c) forming, within said trench, a semiconductor region over said dielectric layer by epitaxial growth within said trench, such that said semiconductor region substantially fills said trench.

Thus, the substrate is first patterned to define the location at which the SOI region is to be formed, and the dielectric layer is deposited and etched (so that it only covers the base of the trench), before the selective deposition (by epitaxial growth) of the semiconductor material defining the localized SOI region. As a consequence, said selective deposition is carried out by lateral epitaxial growth, or by a combination of lateral epitaxial growth and non-selective epitaxial growth. If a recrystallisation is needed, e.g. particularly in the case where non-selective growth takes place as well, this recrystallisation can be effected under less heavy conditions than the complete remelting needed in the prior art; e.g. one may use a lower temperature or a straightforward anneal. This evidently is advantageous from a process control perspective, but furthermore also reduces the risk of stress build-up in the substrate due to the very high temperature needed for melting (above 1400° C.).

In a preferred embodiment, the semiconductor region is selectively formed over the dielectric layer within the trench by selective lateral epitaxial growth (i.e. selective to the non-semiconducting layer) from the sidewalls of the trench. Thus, there is no requirement to form the SOI region by thermal treatment of a polycrystalline region and, therefore, no possibility that polycrystalline material may remain in the SOI region as in the above-mentioned prior art. Furthermore, other structures can be formed on the substrate before it is patterned to define the localized SOI regions.

In a further embodiment, particularly a further modification of the latter embodiment, the semiconductor material of the SOI region is chosen different from the substrate material. Preferably, a material is chosen for the SOI region that has the same crystal type and similar lattice constant as the substrate material in order to facilitate epitaxial growth. Suitable materials include Ge, SiGe, SiC in case of use of silicon as the substrate material, though III-V materials are not excluded in principle. SiGe is the most preferred example.

Most suitably, the trench has a depth of less than 200 nm. It is therewith substantially thinner than the polycrystalline layer of the prior art, which was 10-30 microns thick. Preferably, the trench depth is even less than 100 nm. For transistors to be operated in fully depleted mode a channel thickness, and hence a trench depth below 50 nm is preferable.

This is fully compatible with the manufacturing technique of the present invention. Moreover, due to the small thickness, any mismatch in crystal lattice or thermal expansion will not have a dramatic effect on the stability of the resulting substrate with localized SOI region.

The dielectric layer can in principle be any electrically insulating layer. A layer with a low dielectric constant is preferred to reduce any electrostatic coupling between the semiconductor material of the localized SOI region and the substrate. For compatibility with standard CMOS processing, oxide, oxynitride and nitride are best suitable materials. A combination of a standard material (i.e. oxide, oxynitride and nitride) with another material with other properties, is however by no means excluded. Preferably, the dielectric layer has a thickness of less than 250 nm, similar to commercially available SOI wafers. In case a transistor to be operated with a fully depleted channel and a thin channel is intended to be formed in and around the localized SOI region, the dielectric layer preferably has a thickness of less than 80 nm and more preferably below 50 nm.

Under some circumstances, the occurrence of a triangular epitaxial growth profile may give rise to a triangular void between the epitaxied semiconductor material and the buried dielectric. The term 'triangular growth profile' is herein derived from the growth profile as seen in a vertical cross-section. This resulting void also acts as an electrical insulator, and has the advantage that the dielectric constant is 4 times lower than SiO2 leading to very low coupling between film and substrate, which may be particularly useful when using the thin film as a channel for CMOS devices. The size of the void can be reduced, if required, by annealing after the epitaxial growth process as the system tends to minimise its surface energy. This is advantageously done before the CMP process for planarising to the SOI region.

In an alternative exemplary embodiment, a combination of selective epitaxial growth and non-selective epitaxial growth may be used. Herein, semiconductor regions adjacent to a side wall of the trench (i.e. an exposed section of the monocrystalline substrate) will be formed in a selective epitaxial growth mode. Semiconductors regions in the center of the trench and regions remote from the buried dielectric layer will be formed in a non-selective epitaxial growth mode. Suitably, the selective epitaxial growth occurs in a deposition step preceding the non-selective epitaxial growth process. However, it is by no means excluded that the two growth modes occur in a single process step. In fact generally, an epitaxial monocrystalline layer will be formed adjacent to the side walls (selective mode), whereas a polycrystalline layer is formed elsewhere (non-selective mode). The polycrystalline layer is then to be recrystallized subsequently. This can be done in friendly manner, i.e. at relatively low temperatures in comparison to the remelting used in the prior art. The embodiment has the advantage that it is more robust; e.g. if for some reason the epitaxial growth has a bad wetting behavior to the buried dielectric layer.

This embodiment also offers the option of deposition of another material in the localized SOI-region than in the substrate. Any portion of the non-selective growth outside the trench region is preferably removed afterwards, and hence there are no further boundary conditions to its composition. In this case, silane (SiH4) or germane (GeH4) may advantageously be used as precursors. The epitaxy temperature is preferably 500° C.-800° C.

Suitably, the manufacture of integrated circuit continues with implantation and diffusion steps after the provision of the substrate with the localized SOI region. However, it is not excluded that certain implantation steps are carried out prior to the provision of the semiconductor material into the trench. This is made possible in that the effective temperature needed for said provision and any recrystallisation is relatively low, i.e. preferably even lower than 800° C. This early implantation step ensures that the semiconductor material in the localized SOI region is kept free of charge carriers due to implantation.

In a further embodiment, this definition of a localized SOI region may be preceded or may precede the provision of other trench type devices in the substrate. In addition to the provision of shallow trench oxidation as part of conventional integrated circuit manufacture, several trench devices have been developed for specific applications, including trench capacitors, trench transistors, trench batteries and through-wafer via holes. The combination of such devices with the present localized SOI region is considered advantageous, for the reason that the localized SOI region provides the option to define high-quality transistors on whatever substrate material. There is a larger freedom in choosing the semiconductor material on top of the buried dielectric. Moreover, the provision of the semiconductor material occurs under relatively gentle conditions not prohibiting that other elements have been defined in the substrate prior to definition of the localized SOI region.

The invention also extends to the resulting semiconductor substrate, and to a semiconductor device comprising such resulting semiconductor substrate.

Particularly, the semiconductor substrate is characterized in that it comprises a region with a buried dielectric layer on top of which a layer of a semiconductor material at least partially generated by lateral epitaxial growth is present. Due to the lateral growth a very regular material structure is formed, that is clearly improved over the prior art structure requiring full remelting and recrystallisation. Such recrystallisation does not lead to lateral growth, but to crystal growth starting from a single or a limited number of crystal nuclei—in other words, it will lead to further growth of one or more of the crystalline areas already present in the polycrystalline silicon. The laterally grown structure of the invention has the benefits of better adhesion to the substrate. This is particularly advantageous in case that the localized SOI region has a size similar to the channel size of a single field effect transistor.

The transistor electrodes are in that case defined largely adjacent to the localized SOI region. If the interface between the localized SOI region and the substrate were rough or contain charges, then this might result degraded mobility. Since the channel and electrodes form the essential part of the transistor, it would immediately have a negative impact on the transistor operation.

Most suitably, the semiconductor layer on top of the buried dielectric layer has a thickness of less than 200 nm, suitably less than 100 nm, and for certain applications less than 50 nm, or even less than 30 nm. Additionally, the buried dielectric layer has a thickness in the order of 20-250 nm, suitably 20-150 nm and for certain application preferably less than 70 nm.

In one embodiment, a void is present between the buried dielectric layer and the semiconductor layer. This constitutes an effective barrier against capacitive coupling between the substrate and the semiconductor layer.

In another embodiment, zones of polycrystalline silicon may be defined within the semiconductor layer on the buried dielectric layer. Such polycrystalline zones, effectively residues from a non-complete transformation of the polysilicon formed in a non-selective epitaxial growth mode as described above, may be helpful for adequate adhesion. However, as long as the localized SOI region is relatively small, such adhesion zones are not deemed necessary or advantageous. Alternatively, these polycrystalline zones can be designed for other purposes, i.e. engineering of the charge transport within the channel.

In a further embodiment, the semiconductor layer on the buried dielectric layer has another composition than the semiconductor substrate. Suitably, the composition of the semiconductor layer forms a crystal with a crystal lattice similar to that of the substrate material. In case of use of silicon as the substrate material, preferred materials for the semiconductor layer include SiGe and SiC.

The semiconductor device is characterized as having the substrate of the invention.

More suitably, the substrate comprises a plurality of localized SOI regions. The location and size of each of these regions will be determined on the basis of the layout. Most suitably, a single localized SOI regions has a size corresponding to the channel of a field effect transistor. The actual size depends on the type of transistor (NMOS, PMOS), its application (I/O cell versus logic versus memory driver) and the process node (C65, C45, C90, CMOS018). In such a case, most suitably, the source and drain electrodes are defined adjacent to the localized SOI region. Preferably, the localized SOI region is chosen to have a slightly larger size than the channel, so as to increase the robustness of manufacturing. For instance, lowly doped source and drain extensions may be defined within the localized SOI region. It will be clear that many modifications are possible here, including:
- the definition of the channel asymmetrically with respect to the localized SOI region (e.g. not exactly in the center),
- the provision of a drain extension only,
- the definition of a planar transistor suitable for fully depleted operation, (desired for low standby power, low power and even high performance devices, particularly but not exclusively for the devices in the 45 nm node and beyond.)
- the definition of a trench in a fork-shaped structure, to allow an interdigitated layout of the transistor (implying a large side wall enabling proper lateral growth).

Another advantage of the limitation of the SOI region to a single transistor is that the silicidation of source and drain electrodes may be achieved without any further epitaxy—in contrast to the manufacture with conventional SOI wafers.

In case of use as a memory driver, the transistor on the buried dielectric layer is most suitably an access transistor. For SRAM memories, it is most beneficial to have a full inverter on the buried dielectric layer. It will be understood that the advantage of having a channel in the semiconductor layer separate from the substrate is substantial, i.e. a decrease in dopant concentration in the channel is enabled, leading to a higher mobility. Moreover, a better VT mismatch behaviour can be achieved, which solves one of the major problems in highly scaled, i.e. advanced short-channel SRAM cells.

These and other aspects of the invention will be apparent from, and elucidated with reference to, the embodiments described herein.

BRIEF DESCRIPTION OF THE DRAWINGS

Embodiments of the present invention will now be described by way of examples only, and with reference to the accompanying drawings, in which.

DETAILED DESCRIPTION OF EMBODIMENTS

Figure 1A:
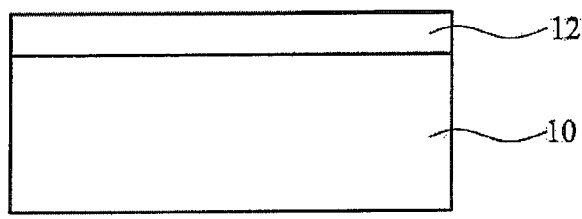
FIG. 1A to L are schematic cross-sectional diagrams illustrating the principal dteps of a fabrication method according to a first exemplary embodiment of the present invention.
Figure 1B:
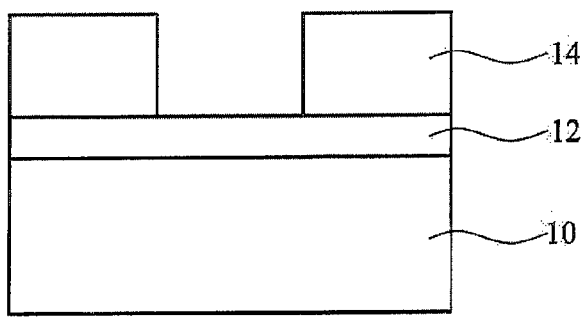
Figure 1C:
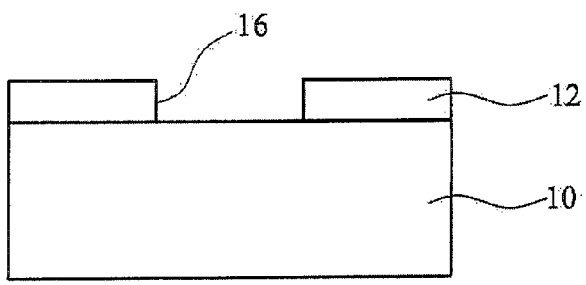
Figure 1D:
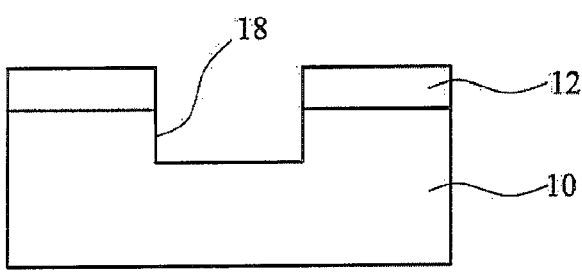
Figure 1E:
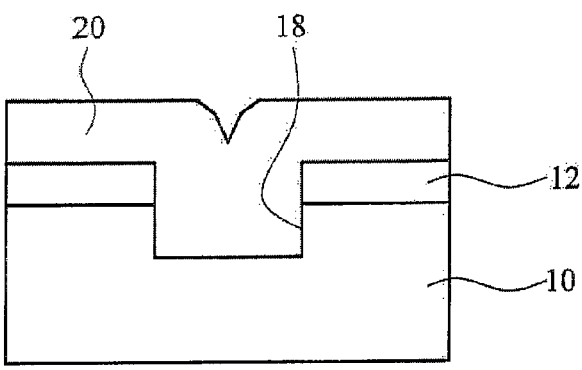
Figure 1F:
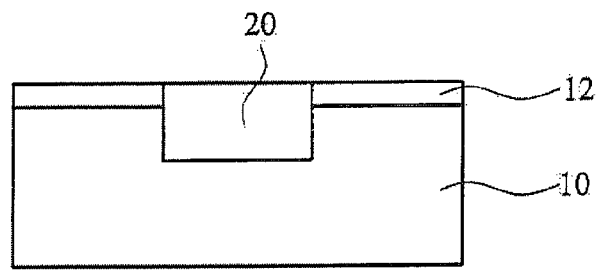
Figure 1G:
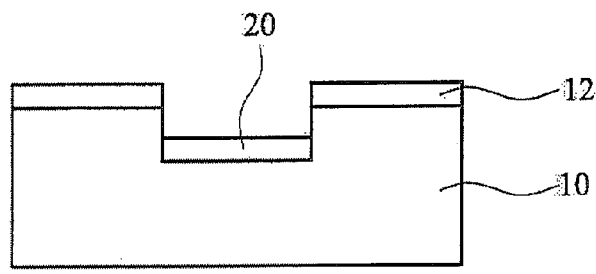

Referring to FIG. 1A of the drawings, starting with a first semiconductor substrate 10 (Si, Ge, SiGe, GaAs, or other), a dielectric hard mask 12 is deposited over the surface of the substrate 10. The hard mask 12 is patterned by photolithography to define the required location of the SOI structure. Thus, referring to FIG. 1 of the drawings, a patterned photoresist layer 14 is applied over the hard mask 12, and the hard mask 12 is thus etched to define an opening 16 at the required location of the SOI region, before removal of the resist layer, as illustrated in FIG. 1C. Referring to FIG. 1D of the drawings, next a trench 18 is etched in the semiconductor substrate 10 to a convenient depth, depending on the desired thickness of the final insulator layer and semiconductor region. Referring to FIG. 1 E of the drawings, a dielectric layer 20 is deposited homogeneously over the structure, such that the trench 18 is filled with said dielectric material 20 and the dielectric material is then removed (by a CMP process) from the areas of the wafer protected by the hard mask 12, leaving only the trench 18 filled with dielectric material, as shown in FIG. 1F. Further thinning of the dielectric material can be achieved by a selective wet or dry etching step, to leave a thin dielectric layer 20 over the base of the trench 18, as illustrated in FIG. 1G.

Figure 1H:
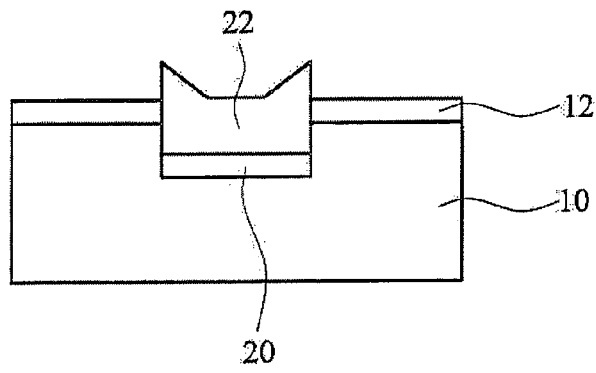
Figure 1I:
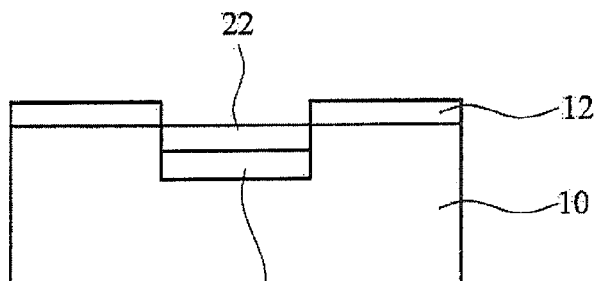

Next, a semiconductor material 22 (which may be the same as that of the substrate 10, or not, (as required) is deposited, by lateral epitaxial growth, within the trench 18 over the dielectric layer 20, as illustrated in FIG. 1H. It will be appreciated that, if the second semiconductor material 22 is not the same as that of the semiconductor substrate 10, its crystal type must at least match that of the substrate and its lattice constant should be similar, to ensure good epitaxial growth. The epitaxy conditions need to be chosen carefully so that faceting does not occur and the semiconductor material 22 "wets" the dielectric layer 20.

Figure 1J:
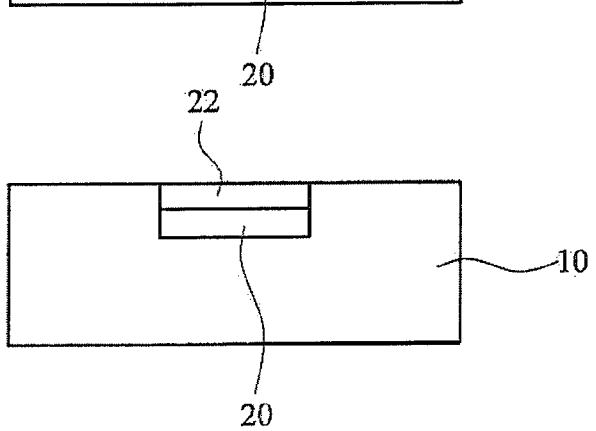
Figure 1K:
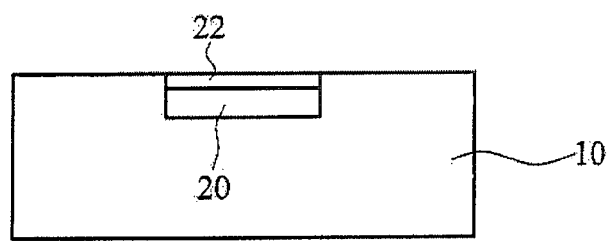
Figure 1L:
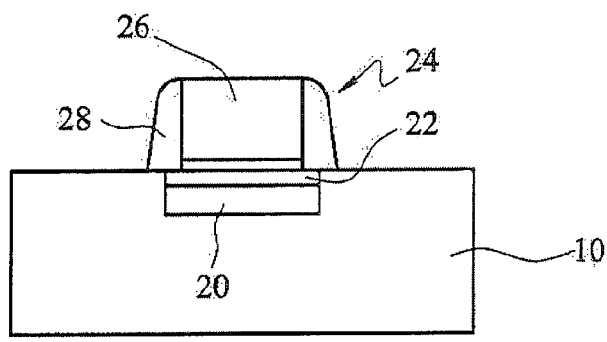

The semiconductor layer 22 thus deposited is planarised by a second CMP process and thinned by a subsequent selective wet or dry etching process (see FIG. 1I) and then the hard mask 12 is removed (see FIG. 1J). In a final step, both the substrate 10 and the deposited semiconductor layer 22 can be etched to obtain the desired film thickness without inducing a step height (see FIG. 1K) Annealing may be performed to repair any dislocations that may have occurred (between the SOI layer 22 and the substrate 10 or the dielectric layer 20.

The substrate thus fabricated may be used as a starting substrate for CMOS applications, for example, with the gate of a CMOS device 24 (illustrated in FIG. 1L as comprising of a polysilicon region 26 and spacers 28) advantageously situated on the SOI region.

It will be well known to a person skilled in the art that epitaxy involves the growth of crystals of one material on the crystal face of another (or the same) material. Epitaxy forms a thin film whose material lattice structure and orientation or lattice symmetry is identical to that of the substrate on which it is deposited. Most importantly, if the substrate is a single crystal, then the thin film will also be a single crystal.

The process conditions required to achieve the above-mentioned selective expitaxial growth are dictated by the semiconductor material used. The preferred process conditions in the case of silicon (Si) and SiGe are given below.

In both cases, the surface is preferably cleaned to remove oxide residues, before epitaxy is performed, preferably by HF clean (normally ex-situ), followed by an in-situ H2 "prebake" (anneal in H2 ambient) at typically 850° C. For Si the precursor is preferably $SiCH_2Cl_2$ (Dichloresilane) and the epitaxy temperature is between 650° C. and 900° C. (typically 700° C.-800° C.). For SiGe, $GeH_4$ is preferably added into the epitaxy chamber and the process temperature is slightly lower (typically 600° C.-700° C.), the final composition in both cases being dependent on the ratio of the precursors.

Figure 2:
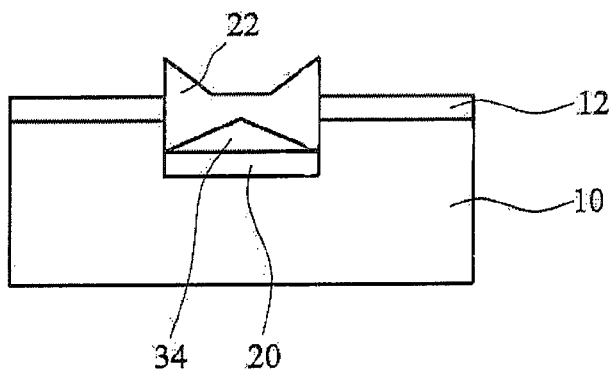
FIG. 2 is a schematic cross-sectional diagram illustrating a structure formed in accordance with said first exemplary embodiment of the invention.

Referring to FIG. 2 of the drawings, under some circumstances, the occurrence of a triangular epitaxial growth profile may give rise to a triangular void 34 between the epitaxied silicon 22 and the buried dielectric 20, as depending on the crystal orientations, there might be some crystalline planes with accelerated growth, which are not parallel to the trench wall.

This resulting void 34 acts equally as an electrical insulator, and has the advantage that the dielectric constant is 4 times lower than SiO2 leading to very low coupling between film and substrate, which may be particularly useful when using the thin film as a channel for CMOS devices. The size of the void can be reduced by annealing after the epitaxial growth process as the system tends to minimize its surface energy. This is advantageously done before the CMP process for planarising the SOI region.

In an alternative exemplary embodiment, instead of using selective epitaxy, non-selective epitaxy could be used to fill the trench over the dielectric layer 20. In this case, silane (SiH4) or germane (GeH4) may be used as precursors. The epitaxy temperature is preferably 500° C.-800° C.

Figure 3A:
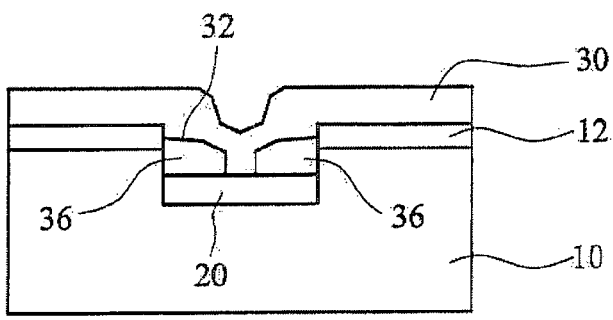
FIGS. 3A and 3B are schematic cross-sectional diagrams illustrating a structure formed in accordance with a second exemplary embodiment of the invention.
Figure 3B:
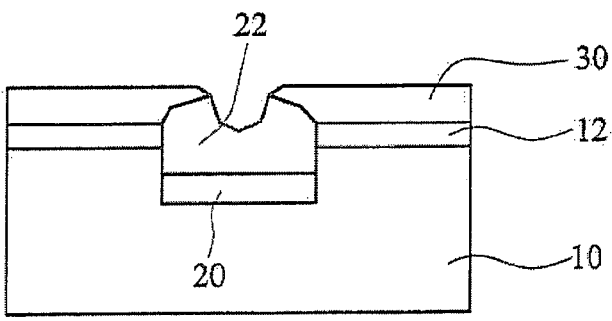

Referring to FIG. 3A, a dielectric hard mask 12 is provided over the surface of the substrate 10 around the trench. Thereafter, in this example silicon is deposited by epitaxy.

This causes formation of polysilicon 30 in a non-selective epitaxial growth mode. It further causes the formation of monocrystalline silicon 36 in a selective epitaxial growth mode at the at least one side wall of the trench. The volume ratio of poly-Si and crystalline Si in the trench will be defined by the geometry of the trench. After the epitaxy step, "solid phase epitaxy" i.e. an anneal, typically between 500° C. and 750° C., and of duration typically between 30 s and several minutes, is preferably used to crystallise the future thin film layer completely using the side walls as crystal seeds imposing their structure eliminating preferably all dislocations in this area. Equally, the anneal could alternatively be performed after CMP and hard mask removal. The duration of the required duration of the anneal for solid phase epitaxy increases significantly with decreasing annealing temperature. For example, at 700° C., the duration might be around 30 seconds, whereas at 600° C., the required duration is more likely to be in the range 2-3 minutes. It will be apparent to a person skilled in the art that any intermediate annealing temperature would necessitate an intermediate duration.

As the Si (i.e. substrate) surface is higher than the dielectric surface (at the base of the trench) before epitaxy, real epitaxial growth occurs on the side walls of the trench limiting the poly-Si growth in the center of the trench. This facilitates the final obtention of a good quality crystal film on the buried dielectric after annealing.

In accordance with the method of the present invention, a single crystal structure of the SOI region is ensured, in contrast to the prior art method outline above.

Further, the above-referenced prior art method uses epitaxy to form the bulk regions either side of the SOI region. Therefore, the SOI region must be of the same material as the substrate. In contrast, in the present invention, the bulk regions either side of the SOI region are formed by the original substrate, so the SOI region can be of a different material to that of the substrate, provided the crystal types are the same and the lattice constants are similar. Still further, the proposed process flow enables patterning of the SOI regions after other structures have been formed in or on the substrate. Which is not the case with the prior art method. The localized SOI region acts preferably at least largely as a channel of a transistor. Preferably, a plurality of localized SOI regions are present in the substrate, to accommodate a plurality of transistors. However, it is not excluded that some transistors are defined completely in the substrate. It is moreover not excluded that the localized SOI region comprises more than one transistor, or that the localized SOI region is defined for another type of device than a transistor. An example hereof is a diode, in which the semiconductor layer may be used as one of the zones. The junction may then be on top of the semiconductor layer, with preferably a metal layer (to define a Schottky junction). Alternately, the junction may be laterally around the localized SOI region, to define a traditional pn junction or optionally to define a p-I-n diode. In the latter case, both the p-type region and the n-type region may be defined in a localized SOI region.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of forming a localized semiconductor-on-insulator (SOI) structure in a bulk semiconductor substrate, the method comprising:
   forming a trench in the surface of said substrate at a required location thereon of said SOI structure;
   forming a dielectric layer on the base of said trench, leaving a portion of the semiconductor sidewalls thereof exposed; and
   forming, within said trench, a semiconductor region over said dielectric layer by epitaxial growth within said trench, producing an insulative void space defined by the semiconductor region and the dielectric layer, such that said semiconductor region substantially fills said trench.

2. A method according to claim 1, wherein the semiconductor region is selectively formed over the dielectric layer within the trench by selective lateral epitaxial growth from the sidewalls of the trench, and wherein said semiconductor region formed of SiGe, and the precursor for said lateral epitaxial growth is GeH$_4$, and wherein the epitaxy temperature is in the range of about 600° C. to about 700° C.

3. A method according to claim 1, wherein said semiconductor region is formed by lateral epitaxial growth of silicon (Si) or SiGe.

4. A method according to claim 3, wherein the surfaces of the side walls of said trench are cleaned to remove oxide residues, before said selective lateral epitaxy is performed.

5. A method according to claim 1, wherein said semiconductor region is formed of silicon, and the precursor for said lateral epitaxial growth is SiH$_2$Cl$_2$ (Dichlorosilane), and wherein the epitaxy temperature is in the range of about 650° C. to about 900° C.

6. A method according to claim 2, wherein an annealing process is performed after the epitaxial growth process so as to reduce the size of any void created between said semiconductor region and said dielectric layer.

7. A method according to claim 1, wherein a dielectric hard mask is provided over the surface of the substrate around the trench, and monocrystalline semiconductor material is deposited all over the structure, such that polycrystalline semiconductor material is formed on the hard mask and on the dielectric layer and monocrystalline semiconductor material is formed at the side walls of the trench, wherein said monocrystalline semiconductor material comprises silicon which is deposited on said structure by non-selective epitaxy.

8. A method according to claim 7, wherein silane or germane are used as precursors for said non-selective epitaxy, and the epitaxy temperature is in range of about 500° C. to about 800° C.

9. A method according to claim 7, further comprising an annealing step to crystallize said semiconductor completely.

10. A semiconductor substrate having at least one localized semiconductor on insulator structure, comprising a buried dielectric layer on top of which a layer of a semiconductor material at least partially generated by lateral epitaxial growth is present, wherein the layer of semiconductor material has a thickness of less than about 200 nm, wherein a void is present between the buried dielectric layer and the layer of semiconductor material, and wherein a zone of polycrystalline material is present within the layer of semiconductor material, which zone has an interface with the buried dielectric layer.

11. A semiconductor device comprising the semiconductor substrate as claimed in claim 10.

12. A semiconductor device as claimed in claim 11 comprising a field effect transistor having a channel, which is defined within the localized SOI structure.

13. A semiconductor device as claimed in claim 12, wherein the transistor is operated as a fully depleted device.

14. A semiconductor device as claimed in claim 11, comprising a diode with a first region of a first conductivity type and a second region, wherein the localized SOI structure forms the first region, and wherein the diode is a Schottky diode with the second region defined in a layer on top of the localized SOI structure.

15. A semiconductor device as claimed in claim 11, further comprising a trench device defined in the substrate in addition to the localized SOI structure.

16. The method according to claim 5, wherein the epitaxy temperature is in the range of about 700° C. to about 800° C.

* * * * *